United States Patent
Ha

(10) Patent No.: US 7,161,858 B2
(45) Date of Patent: Jan. 9, 2007

(54) MEMORY DEVICE FOR PREVENTING LOSS OF CELL DATA

(75) Inventor: Sung-Joo Ha, Ichon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 91 days.

(21) Appl. No.: 10/878,493

(22) Filed: Jun. 29, 2004

(65) Prior Publication Data

US 2005/0141293 A1   Jun. 30, 2005

(30) Foreign Application Priority Data

Dec. 29, 2003   (KR) .................... 10-2003-0098438

(51) Int. Cl.
*G11C 7/00* (2006.01)

(52) U.S. Cl. .................... 365/203; 365/230.03

(58) Field of Classification Search ............. 365/203
See application file for complete search history.

(56) References Cited

U.S. PATENT DOCUMENTS 5,748,560 A * 5/1998 Sawada .................... 365/233
6,014,340 A * 1/2000 Sawada .................... 365/233
6,104,651 A * 8/2000 Cowles et al. ............. 365/203
6,891,393 B1 * 5/2005 Sugamoto et al. ......... 365/201

FOREIGN PATENT DOCUMENTS

KR   1020030059487   7/2003

* cited by examiner

*Primary Examiner*—Thong Q. Le
(74) *Attorney, Agent, or Firm*—Mayer Brown Rowe & Maw LLP

(57) ABSTRACT

A semiconductor memory device for improving its reliability by preventing the loss of cell data, which includes an active driving block for generating an internal active signal to drive a bank, a precharge signal generating block for producing an internal precharge signal to precharge the bank, and an active drive securing block for controlling the precharge signal generating block to make the internal precharge signal actuated after a minimum row active time is passed in response to the internal active signal.

13 Claims, 11 Drawing Sheets

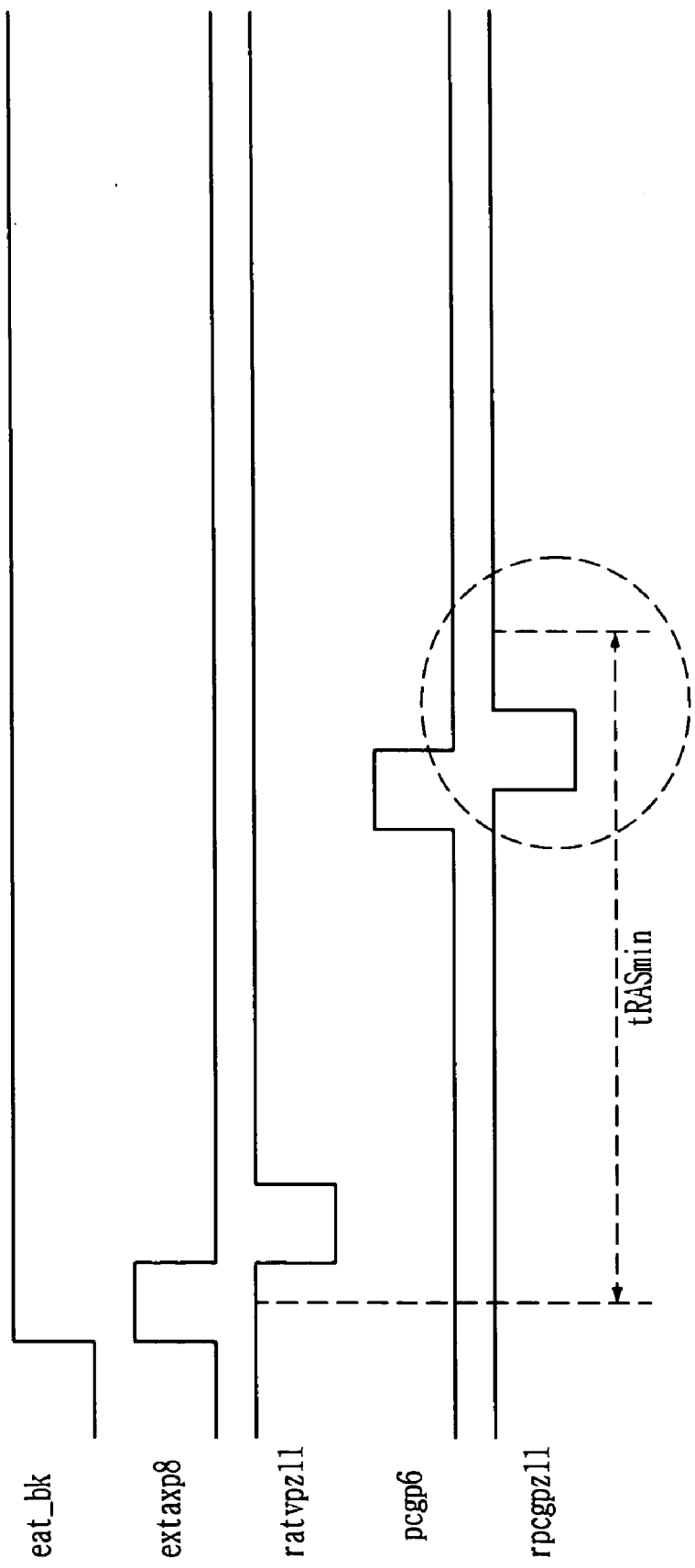

MEMORY DEVICE FOR PREVENTING LOSS OF CELL DATA

FIELD OF THE INVENTION

The present invention relates to semiconductor design technology; and, more particularly, to a semiconductor memory device for preventing the loss of cell data.

BACKGROUND OF THE INVENTION

Hereinafter, there is briefly explained a memory cell access procedure of a general dynamic random access memory (DRAM).

At first, if an active command and a row address are inputted to the DRAM, data of memory cells connected to a word line actuated by the row address are coupled to pairs of bit lines, wherein there occurs a minute voltage difference between two corresponding bit lines according to the data stored in the memory cells. The minute voltage difference of the data fed to each pair of bit lines is sense-amplified by a bit line sense amplifier and the data become to have voltage levels which are logically detectable. Then, if a column address is inputted to the DRAM together with a read or write command, data of a certain memory cell amplified by the bit line sense amplifier, which corresponds to a bit line selected by a column selection signal corresponding to the column address, is outputted or an inputted external data is written on a pair of bit lines selected by the column selection signal. After then, the pair of bit lines is precharged in response to a precharge command and initialized so as to respond to a next active command.

Meanwhile, in the above procedure, tRAS represents a time until a next read or write command is inputted after an active command is coupled to the DRAM. A minimum time from the active command inputted to the read or the write command coupled to the DRAM is represented as tRASmin. The tRASmin is a minimum time required for the bit line sense amplifiers detecting memory cell data of a selected word line and it should be secured to prevent the memory cell data from being lost.

FIG. 1 is a block diagram of a conventional semiconductor memory device.

Referring to FIG. 1, the semiconductor memory device includes an active driving block 10 and a precharge signal generating block 20.

The active driving block 10 contains an active signal generating unit 12 for producing an active signal ratvp10 and an internal active signal ratvpz11 based on a refresh-active signal intaxp8 and an external active signal extaxp8 provided from the outside, and an active region detecting unit 14 for detecting an active region from the activation of the active signal ratvp10 to that of a feedback precharge signal rpcgzp11.

The precharge signal generating block 20 has an external precharge detecting unit 22 for detecting an external precharge signal pcgp6, and a pulse adjusting unit 24 for outputting an internal precharge signal rpcgpz11 in response to the actuation of an output signal pcg of the external precharge detecting unit 22 and internally generated precharge signals apcg and sadly.

For the reference, the refresh-active signal intaxp8 is an active command actuated when performing auto-refresh and self-refresh operations. As internally generated precharge signals, there are the auto-precharge signal apcg and the refresh-precharge signal sadly. The auto-precharge signal apcg is activated after an auto-precharge command is inputted and the tRASmin is passed. The refresh-precharge signal sadly is actuated after a refresh command is inputted and the tRASmin is passed.

FIG. 2A provides a circuit diagram of the external precharge detecting unit 22 in FIG. 1.

Referring to FIG. 2A, the external precharge detecting unit 22 contains NMOS transistors NM2 and NM3 connected in parallel to each other whose gates are coupled with a bank driving signal eat_bk and a bank precharge signal eat<10>, respectively, a PMOS transistor PM1 whose gate is inputted with the external precharge signal pcgp6 and whose source and drain are connected to a supply voltage node and an output node, respectively, an NMOS transistor NM1 whose gate is coupled with the external precharge signal pcgp6 and whose drain and source are attached to the output node and a drain of the NMOS transistor NM2, respectively, a NAND gate ND1 which receives a power-up signal pwrup and a signal on the output node to thereby output the precharge signal pcg, and a PMOS transistor PM2 whose gate is coupled with the output signal pcg of the NAND gate ND1 and whose source and drain are connected to the supply voltage node and a drain of the NMOS transistor NM1, respectively.

FIG. 2B describes a circuit diagram of the pulse adjusting unit 24 in FIG. 1.

Referring to FIG. 2B, the pulse adjusting unit 24 contains a NOR gate NR1 receiving the auto-precharge signal apcg, the refresh-precharge signal sadly and the precharge signal pcg, a flip-flop 24a receiving an output signal of the NOR gate NR1 as a set signal and the feedback refresh signal rpcgzp11 as a reset signal, an inverter I1 for inverting an output signal of the flip-flop 24a to thereby output the internal precharge signal rpcgpz11, and an inverter chain 24b for delaying an output signal of the inverter I1 to thereby output the feedback precharge signal rpcgzp11.

FIG. 3 represents a waveform diagram showing an operation of the memory device in FIG. 1, wherein the external precharge signal pcgp6 is inputted before the tRASmin is passed.

Referring to FIG. 3, the bank driving signal eat_bk is activated at first and, then, the internal active signal ratvpz11 is actuated by the active signal generating unit 12 in response to the external active signal extaxp8. After then, if the external precharge signal pcgp6 is inputted thereto, the external precharge detecting unit 22 detects the external precharge signal pcgp6 and the pulse adjusting unit 24 outputs the internal precharge signal rpcgpz11 by using the output signal pcg of the external precharge detecting unit 22.

In the meantime, as mentioned above, if the external precharge signal pcgp6 is inputted before the tRASmin is passed after the external active signal extaxp8 inputted, the memory cell data are lost. In order to detect and amplify the memory cell data of the selected word line after the external active signal extaxp8 is inputted and to secure the cell data stably, the tRASmin should be secured. Therefore, if the external precharge signal pcgp6 is inputted before the tRASmin is passed, the bit line precharge operation starts before the memory cell data of the selected word line are stably secured. As a result, the memory cell data are lost.

The above problem occurs when the external precharge signal is inputted before the tRASmin is passed. This problem does not happen by the auto-precharge signal apcg and the refresh-precharge signal sadly because these signals are internally generated after the tRASmin is passed. On the other hand, this may occur by the external precharge signal pcgp6 because the external precharge signal pcgp6 is provided to the memory device from the outside by a user.

SUMMARY OF THE INVENTION

It is, therefore, an object of the present invention to provide a semiconductor memory device for improving its reliability by preventing the loss of cell data.

In accordance with the present invention, there is provided a semiconductor memory device including an active driving block for generating an internal active signal to drive a bank, a precharge signal generating block for producing an internal precharge signal to precharge the bank, and an active drive securing block for controlling the precharge signal generating block to make the internal precharge signal actuated after a minimum row active time is passed in response to the internal active signal.

BRIEF DESCRIPTION OF THE DRAWINGS

The above and other objects and features of the present invention will become apparent from the following description of preferred embodiments given in conjunction with the accompanying drawings, in which:

FIG. 3 represents a waveform diagram showing an operation of the memory device in FIG. 1;

DETAILED DESCRIPTION OF THE PREFERRED EMBODIMENTS

In the following detailed description, the preferred embodiments of the present invention are set forth in order to provide a thorough understanding of the invention with reference to the drawings. However, it will be understood by those skilled in the art that the present invention may be practiced without these preferred embodiments.

Figure 1:
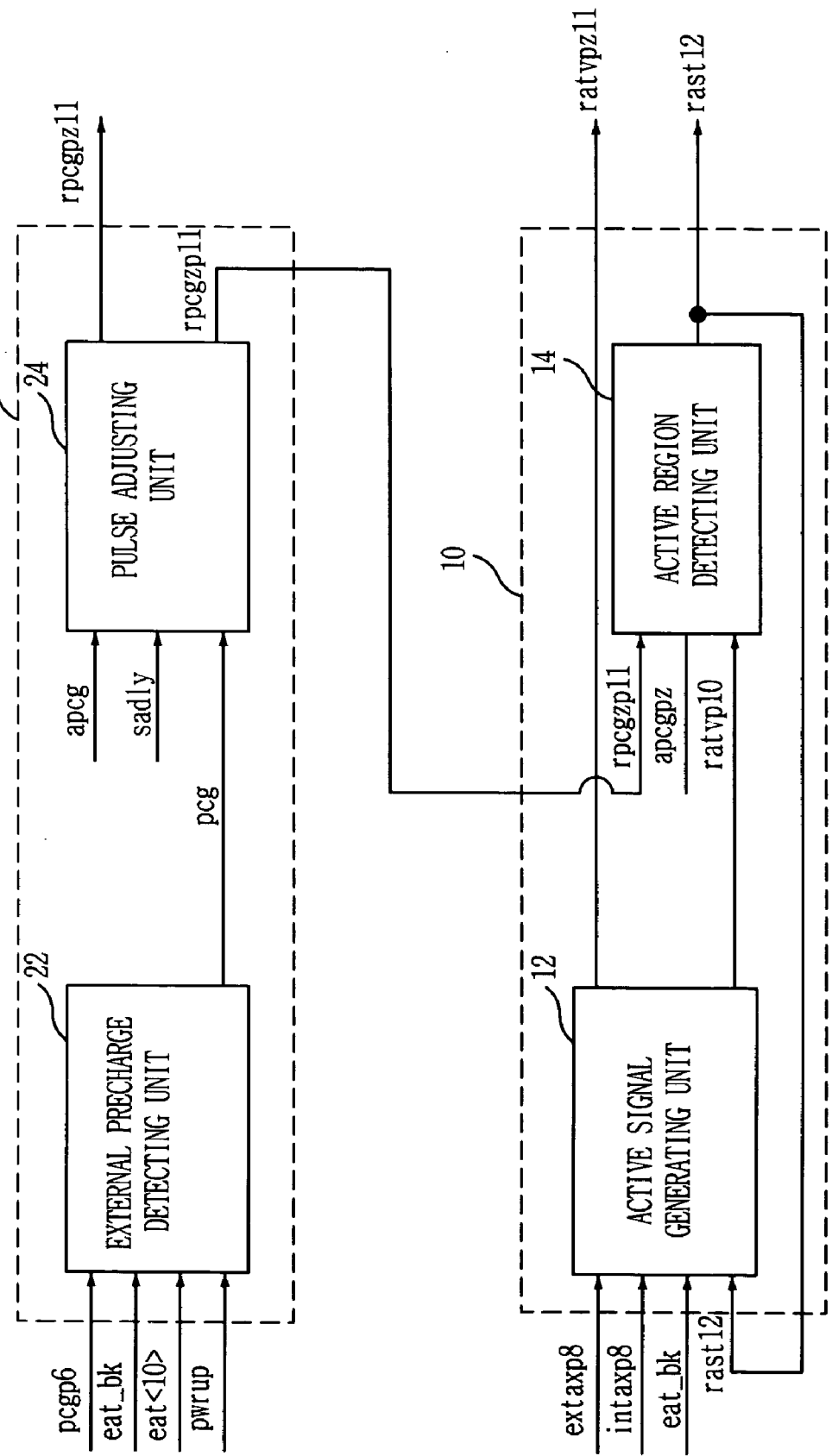
FIG. 1 is a block diagram of a conventional semiconductor memory device.
Figure 2A:
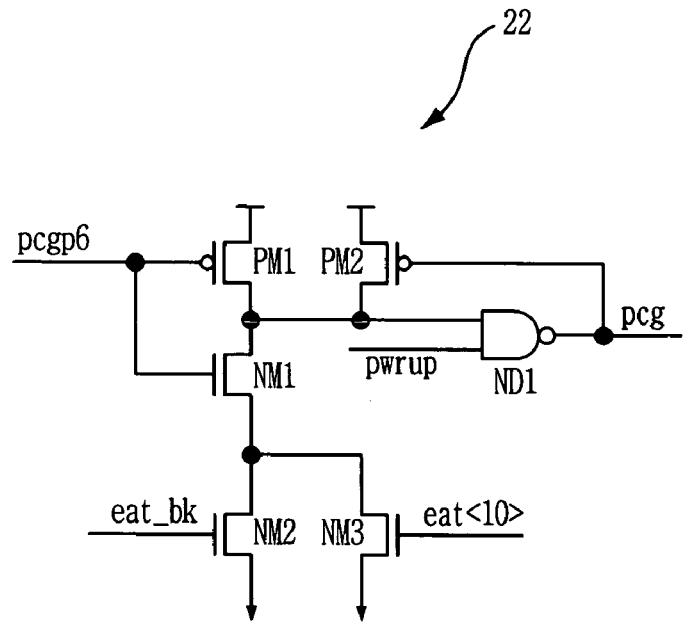
FIG. 2A provides a circuit diagram of an external precharge detecting unit in FIG. 1.
Figure 2B:
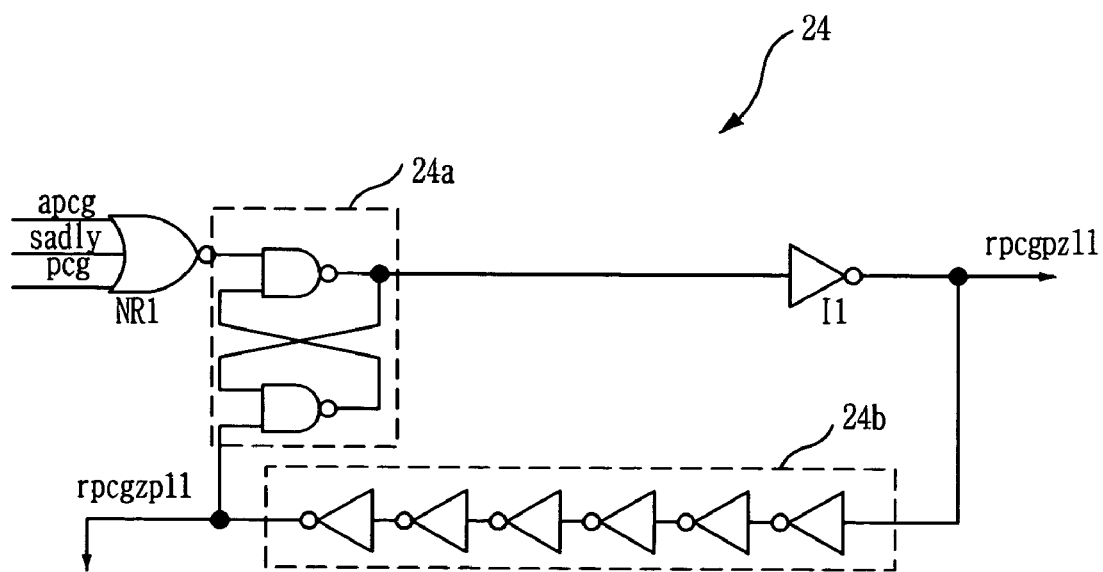
FIG. 2B describes a circuit diagram of a pulse adjusting unit in FIG. 1.
Figure 4:
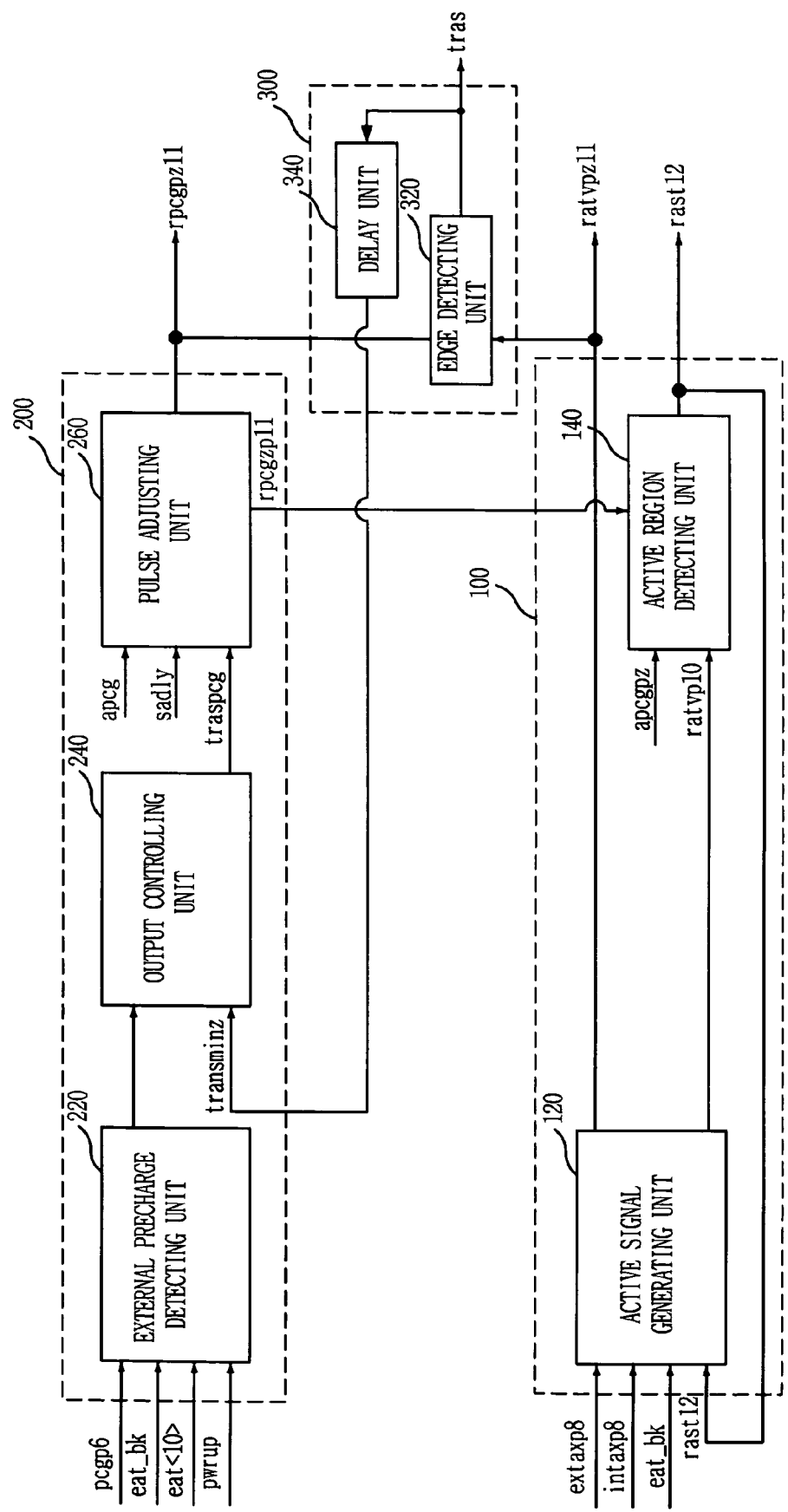
FIG. 4 shows a block diagram of a semiconductor memory device in accordance with the present invention.

FIG. 4 shows a block diagram of a semiconductor memory device capable of preventing the loss of cell data in accordance with the present invention.

Referring to FIG. 4, the semiconductor memory device includes an active driving block 100 for generating an internal active signal ratvpz11 to drive a bank, a precharge signal generating block 200 for producing an internal precharge signal rpcgpz11 to precharge the bank, and an active drive securing block 300 for controlling the precharge signal generating block 200 in response to the internal active signal ratvpz11, thereby activating the internal precharge signal rpcgpz11 after an active time tRASmin is passed.

The active driving block 100 contains an active signal generating unit 120 for producing an active signal ratvp10 and the internal active signal ratvpz11 based on a refresh-active signal intaxp8 and an external active signal extaxp8, and an active region detecting unit 140 for detecting an active region from the activation of the active signal ratvp10 to that of the internal precharge signal rpcgpz11.

The active drive securing block 300 contains an edge detecting unit 320 for detecting an edge of the internal active signal ratvpz11 and a delay unit 340 for delaying an output signal of the edge detecting unit 320 for the tRASmin and outputting a delayed signal.

The precharge signal generating block 200 contains an external precharge detecting unit 220 for detecting an external precharge signal pcgp6, an output controlling unit 240 for delivering an output signal of the external precharge detecting unit 220 under the control of an output signal of the active drive securing block 300, and a pulse adjusting unit 260 for responding to the activation of one of an output signal traspcg of the output controlling unit 240 and internally generated precharge signals sadly and apcg, and adjusting a pulse width of the activated signal, thereby outputting the internal precharge signal rpcgpz11.

Figure 5A:
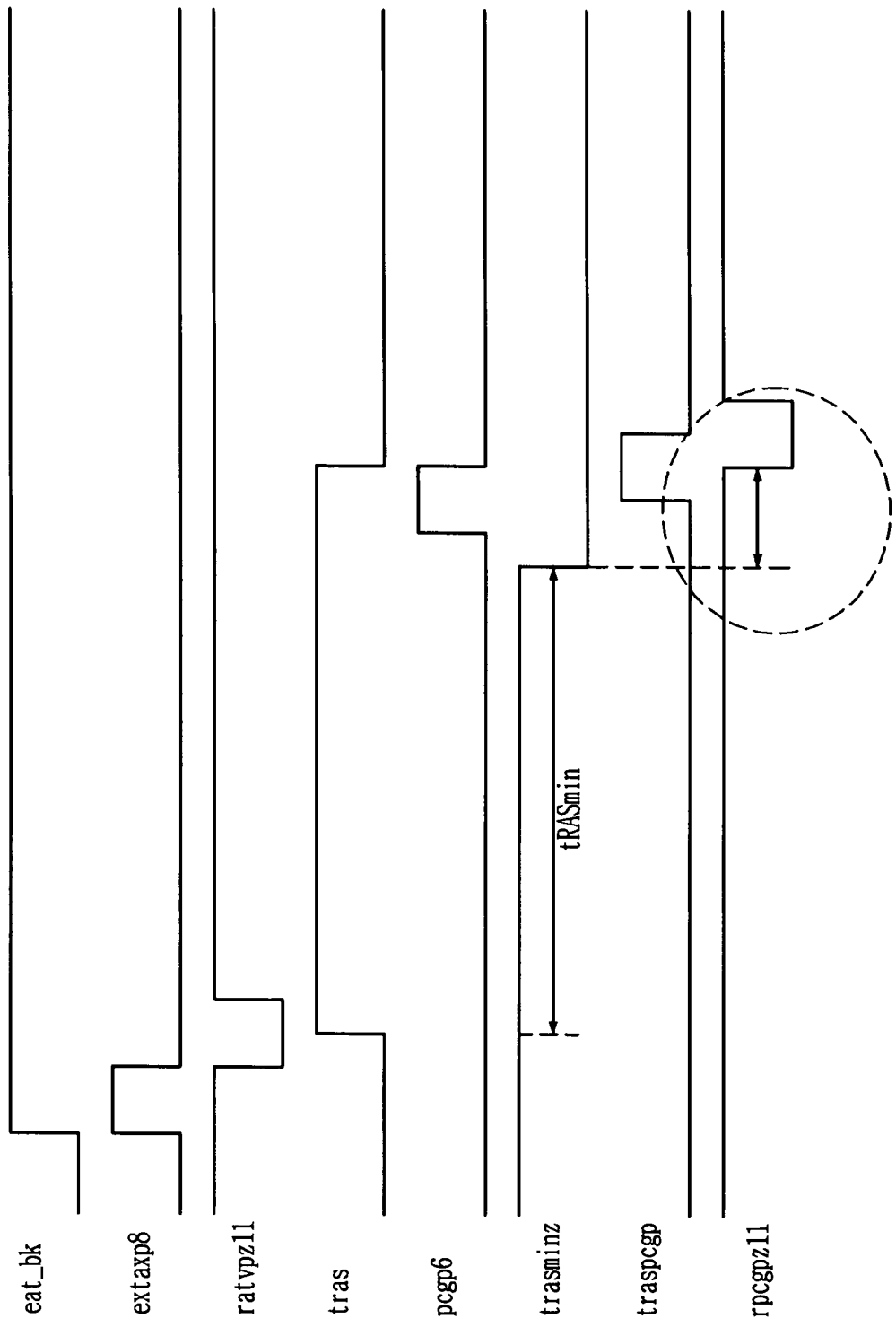
FIGS. 5A and 5B depict waveform diagrams showing an operation of the memory device in FIG. 4.

FIG. 5A depicts a waveform diagram of the memory device in FIG. 4, showing a case that the external precharge signal pcgp6 is inputted to the memory device after the internal active signal ratvpz11 is actuated and the tRASmin is passed.

Referring to FIG. 5A, a bank driving signal eat_bk and the external active signal extaxp8 are activated and then the internal active signal ratvpz11 is actuated through the active signal generating unit 120. After then, the edge detecting unit 320 detects the activation of the internal active signal ratvpz11 and actuates an edge detection signal tras and the delay unit 340 delays the edge detection signal tras as long as the tRASmin and outputs an active drive securing signal trasminz. Sequentially, if the external precharge signal pcgp6 is inputted thereto, the external precharge detecting unit 220 detects it and the output controlling unit 240 outputs the output signal of the external precharge detecting unit 220 as an RAS precharge signal traspcg in response to the active drive securing signal trasminz. The pulse adjusting unit 260 adjusts a pulse width of the RAS precharge signal traspcg and outputs it as the internal precharge signal rpcgpz11.

As described above, the case that the external precharge signal pcgp6 is inputted after the tRASmin is passed represents a normal operation.

Figure 5B:
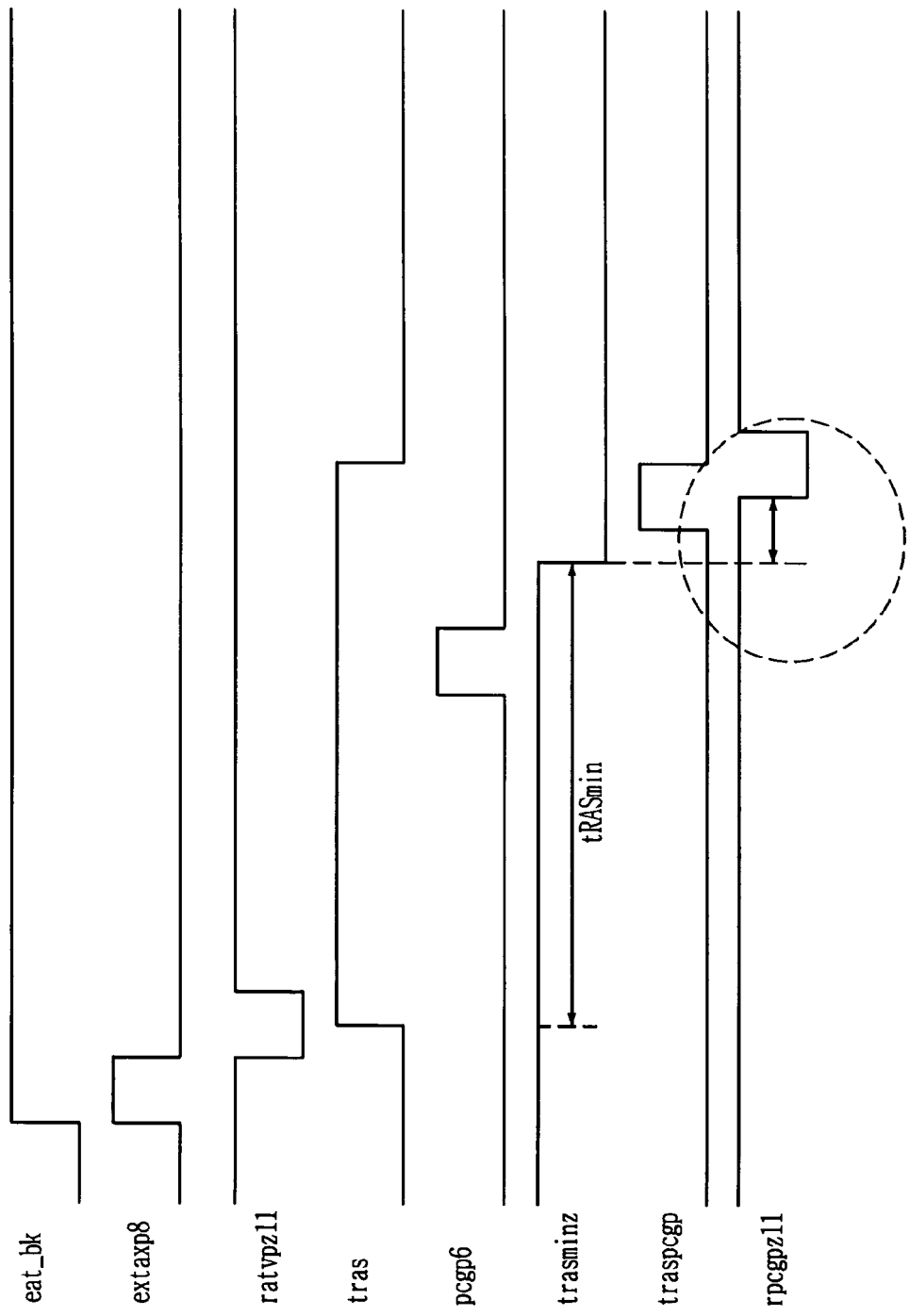

FIG. 5B is a waveform diagram of the memory device in FIG. 4, illustrating a case that the external precharge signal pcgp6 is inputted to the memory device before the tRASmin is passed.

Referring to FIG. 5B, the bank driving signal eat_bk and the external active signal extaxp8 are actuated and then the internal active signal ratvpz11 is activated. After then, the edge detecting unit 320 detects the activation of the internal active signal ratvpz11 and actuates the edge detection signal tras and the delay unit 340 outputs the active drive securing signal trasminz by delaying the edge detection signal tras as long as the tRASmin. The external precharge detecting unit 220 generates its output signal by detecting the external precharge signal pcgp6 and the output controlling unit 240 latches the output signal of the external precharge detecting unit 220 until the active drive securing signal trasminz is activated. Then, if the active drive securing signal trasminz is actuated, the output controlling unit 240 outputs the output signal of the external precharge detecting unit 220 as the RAS precharge signal traspcg. The pulse adjusting unit 260 adjusts a pulse width of the RAS precharge signal traspcg and outputs it as the internal precharge signal rpcgpz11.

Therefore, if the internal active signal ratvpz11 is actuated, the inventive semiconductor memory device delays it as long as the tRASmin to thereby output the active drive securing signal trasminz and uses the active drive securing signal trasminz in adjusting the activation time of the internal precharge signal rpcgpz11 generated by the external precharge signal pcgp6.

Figure 6:
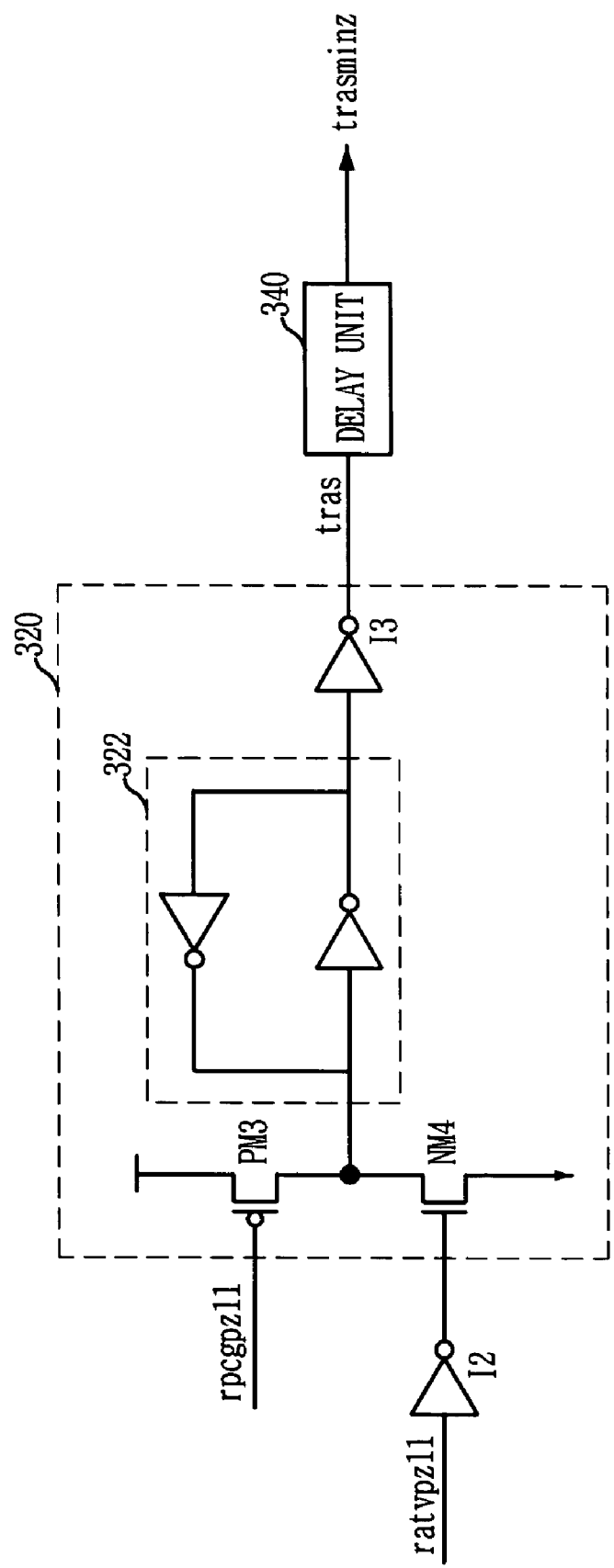
FIG. 6 illustrates a circuit diagram of an edge detecting unit and a delay unit included in an active drive securing block in FIG. 4.

FIG. 6 illustrates a circuit diagram of the edge detecting unit 320 and the delay unit 340 included in the active drive securing block 300 in FIG. 4.

Referring to FIG. 6, the edge detecting unit 320 contains an inverter I2 for inverting the internal active signal ratvpz11, a PMOS and an NMOS transistors PM3 and NM4 which are connected in parallel to each other between a supply voltage node and a ground voltage node and whose gates are inputted with the internal precharge signal rpcgpz11 and an output signal of the inverter I2, respectively, a latch 322 for latching a voltage on a connecting node of the PMOS transistor PM3 and the NMOS transistor NM4, and an inverter I3 for outputting the edge detection signal tras by inverting an output signal of the latch 322.

The edge detecting unit 320 actuates the edge detection signal tras when the internal active signal ratvpz11 is activated and inactivates the edge detection signal tras when the internal precharge signal rpcgpz11 is actuated, so that it is ready to receive a next internal active signal.

Meanwhile, the edge detecting unit 320 detects the actuation of the internal active signal ratvpz11 and secures the minimum time tRASmin for guaranteeing an operation responding to the internal active signal ratvpz11 by using the delay unit 340.

Figure 7A:
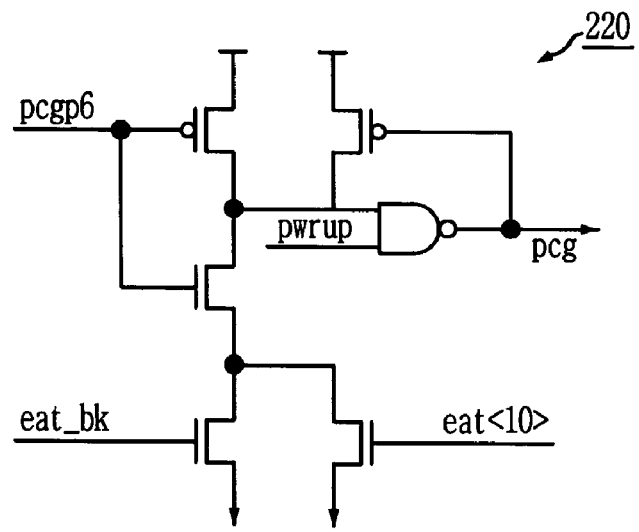
FIGS. 7A to 7C show circuit diagrams of components within a precharge signal generating block in FIG. 4.

FIG. 7A shows a circuit diagram of the external precharge detecting unit 220 included in the precharge signal generating block 200 in FIG. 4.

Referring to FIG. 7A, the external precharge detecting unit 220 actuates its output signal pcg when the bank driving signal eat_bk and the external precharge signal pcgp6 are activated or the bank precharge signal eat<10> and the external precharge signal pcgp6 are enabled. On the other hand, if a power-up signal pwrup is inactivated, the output signal pcg is disabled.

Figure 7C:
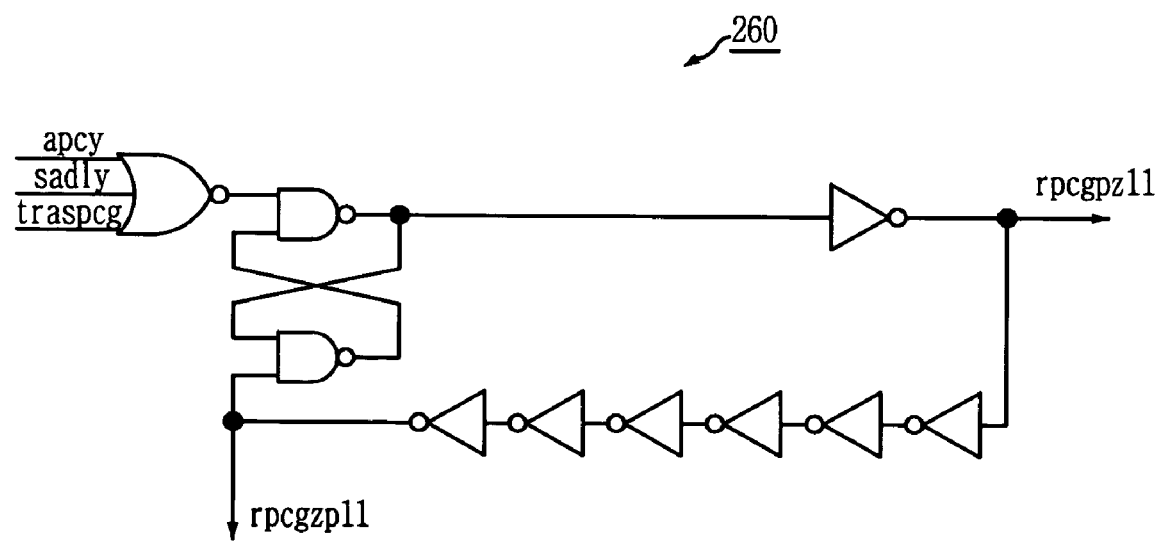
Figure 7B:
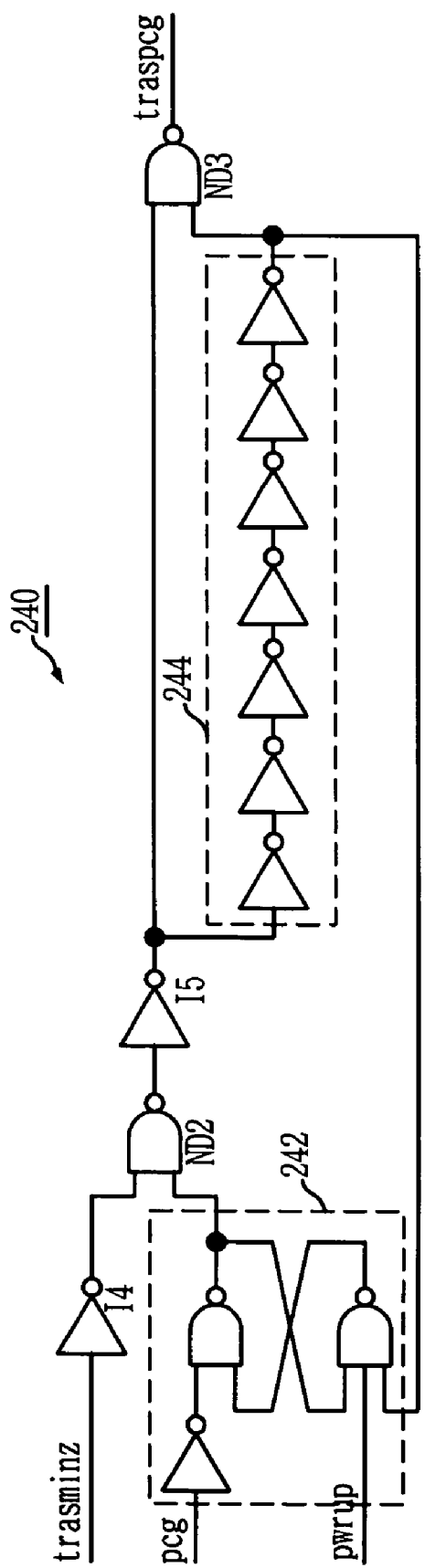

FIG. 7B provides a circuit diagram of the output controlling unit 240 included in the external precharge signal generating block 200 in FIG. 4.

Referring FIG. 7B, the output controlling unit 240 contains an R-S flip-flop 242 whose set signal is the output signal of the external precharge detecting unit 220 and reset signal is the power-up signal pwrup, an inverter I4 for inverting the active drive securing signal trasminz, a NAND gate ND2 receiving an output signal of the inverter I4 and that of the R-S flip-flop 242 as its input signals, an inverter I5 for inverting an output signal of the NAND gate ND2, an inverter chain 244 for inverting and delaying an output signal of the inverter I5, and a NAND gate ND3 for outputting the RAS precharge signal traspcg based on the output signal of the inverter I5 and an output signal of the inverter chain 244.

The output controlling unit 240 latches the output signal pcg of the external precharge detecting unit 220 and outputs the latched signal when the active drive securing signal trasminz is enabled.

If the external precharge signal pcgp6 is inputted before the tRASmin is passed, the output controlling unit 240 latches the external precharge signal pcgp6 to thereby output the latched signal with synchronized to the active drive securing signal trasminz actuated after the tRASmin is passed. Therefore, although the external precharge signal pcgp6 is inputted before the tRASmin is passed, it is compensated internally and thus the loss of cell data is prevented.

FIG. 7C shows a circuit diagram of the pulse adjusting unit 260 included in the precharge signal generating block 200 in FIG. 4.

The pulse adjusting unit 260 outputs the internal precharge signal rpcgpz11 when one of the auto-precharge signal apcg, the refresh-precharge signal sadly and the RAS precharge signal traspcg is actuated.

Figure 8A:
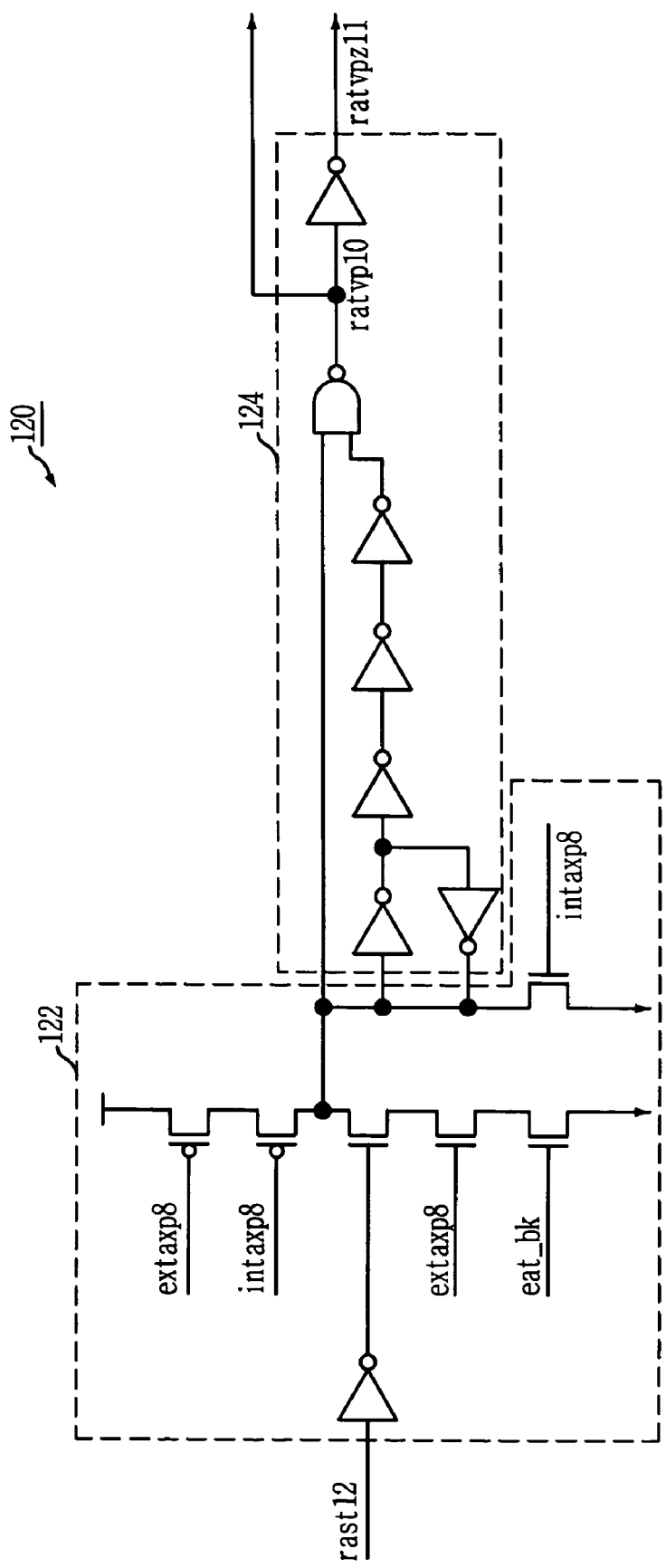
FIGS. 8A and 8B provide circuit diagrams of components within an active driving block in FIG. 4.

FIG. 8A describes a circuit diagram of the active signal generating unit 120 included in the active driving block 100 in FIG. 4.

Referring to FIG. 8A, the active signal generating unit 120 has a signal generating sector 122 for activating its output signal when the external active signal extaxp8, and the bank driving signal eat_bk or the internal active signal intaxp8 are activated, a delay sector 124 for delaying the output signal of the signal generating sector 122 to thereby output the active signal ratvp10 and the internal active signal ratvpz11 obtained by inverting the active signal ratvp10.

Figure 8B:
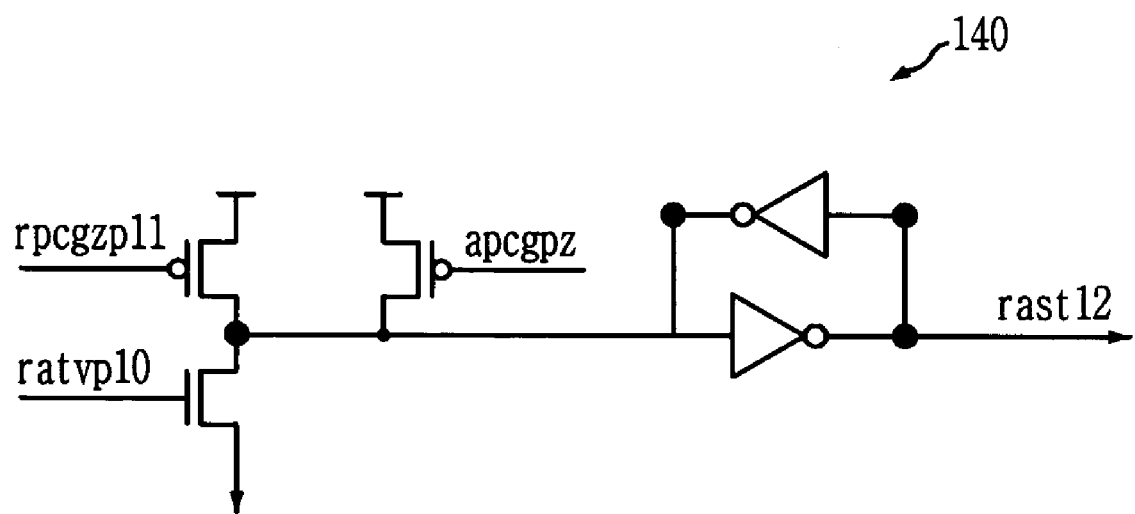

FIG. 8B represents a circuit diagram of the active region detecting unit 140 included in the active driving block 100 in FIG. 4.

Referring to FIG. 8B, if the active signal ratvp10 is coupled thereto, the active region detecting unit 140 actuates a region until a column-precharge signal apcgpz or a feedback precharge signal rpcgzp11 is activated as the active region signal rast12.

This is for the generation of the active region signal rast12 so as to prevent a new internal active signal from being inputted to the same bank during the current internal active signal ratvpz11 enabled.

In accordance with the present invention, although the external precharge signal is coupled to the memory device before the tRASmin is passed during the current internal active signal actuated, the cell data are not lost. If the internal active signal is actuated, since the present invention outputs the active drive securing signal by delaying the internal active signal as long as the tRASmin and uses the active drive securing signal as a control signal when the precharge signal is enabled, the internal precharge signal is not actuated before the cell data are secured. As a result, the present invention can improve the reliability of the memory cell data.

The present application contains subject matter related to Korean patent application No. 2003-98438, filed in the Korean Patent Office on Dec. 29, 2003, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device comprising:
   an active driving means for generating an internal active signal to drive a bank;
   a precharge signal generating means for producing an internal precharge signal to precharge the bank; and
   an active drive securing means for controlling the precharge signal generating means to make the internal precharge signal actuated after a minimum row active time is passed in response to the internal active signal,
   wherein the active driving means includes:
   an active signal generating means for producing an active signal and the internal active signal in response to an external active signal and an internally generated active signal; and an active region detecting means for detecting an active region that is from activation of the active signal to activation of an internal precharge signal to thereby prevent a new internal active signal from being inputted to the bank during the active region.

2. The semiconductor memory device as recited in claim 1, wherein the active drive securing means includes:
an edge detecting means for detecting an edge of the internal active signal and outputting an edge detection signal; and
a delay means for delaying the edge detection signal as long as the minimum row active time.

3. The semiconductor memory device as recited in claim 1, wherein the precharge signal generating means includes:
an external precharge detecting means for detecting a precharge signal inputted from the outside;
an output controlling means for delivering an output signal the external precharge detecting means under the control of an output signal of the active drive securing means; and
a pulse adjusting means for adjusting a pulse width of a signal actuated in response to the activation of one of an output signal of the output controlling means and the internally generated precharge signals and outputting the signal whose pulse width is adjusted.

4. The semiconductor memory device as recited in claim 2, wherein the precharge signal generating means includes:
an external precharge detecting means for detecting a precharge signal inputted from the outside;
an output controlling means for delivering an output signal the external precharge detecting means under the control of an output signal of the active drive securing means; and
a pulse adjusting means for adjusting a pulse width of a signal actuated in response to the activation of one of an output signal of the output controlling means and the internally generated precharge signals and outputting the signal whose pulse width is adjusted.

5. The semiconductor memory device as recited in claim 2, wherein the edge detecting means contains:
a first inverter for inverting the internal active signal;
a PMOS and an NMOS transistor which are connected in parallel to each other between a supply voltage node and a ground voltage node and whose gates are inputted with the internal precharge signal and an output signal of the first inverter, respectively,
a latch for latching a voltage on a connecting node of the PMOS transistor and the NMOS transistor; and
a second inverter for outputting the edge detection signal by inverting an output signal of the latch.

6. The semiconductor memory device as recited in claim 3, wherein the output controlling means contains:
an R-S flip-flop whose set signal is the output signal of the external precharge detecting means and reset signal is a power-up signal;
a first inverter for inverting an output signal the active drive securing means;
a first NAND gate receiving an output signal of the first inverter and that of the R-S flip-flop as its input signals;
a second inverter for inverting an output signal of the first NAND gate;
an inverter chain for inverting and delaying an output signal of the second inverter; and
a second NAND gate for producing the output signal of the output controlling means based on the output signal of the second inverter and an output signal of the inverter chain.

7. The semiconductor memory device as recited in claim 4, wherein the output controlling means contains:
an R-S flip-flop whose set signal is the output signal of the external precharge detecting means and reset signal is a power-up signal;
a first inverter for inverting an output signal the active drive securing means;
a first NAND gate receiving an output signal of the first inverter and that of the R-S flip-flop as its input signals;
a second inverter for inverting an output signal of the first NAND gate;
an inverter chain for inverting and delaying an output signal of the second inverter; and
a second NAND gate for producing the output signal of the output controlling means based on the output signal of the second inverter and an output signal of the inverter chain.

8. A semiconductor memory device comprising:
an active signal generating means for producing an active signal and an internal active signal in response to an external active signal and an internally generated active signal;
an active region detecting means for detecting an active region that is from activation of the active signal to activation of an internal precharge signal to thereby prevent a new internal active signal from being inputted to the bank during the active region; and
an active drive securing means for making the internal precharge signal actuated after a minimum row active time is passed in response to the internal active signal.

9. The semiconductor memory device as recited in claim 8, further comprising a precharge signal generating means for producing the internal precharge signal.

10. The semiconductor memory device as recited in claim 9, wherein the precharge signal generating means includes:
an external precharge detecting means for detecting a precharge signal inputted from the outside;
an output controlling means for delivering an output signal the external precharge detecting means under the control of an output signal of the active drive securing means; and
a pulse adjusting means for adjusting a pulse width of a signal actuated in response to the activation of one of an output signal of the output controlling means and the internally generated precharge signals and outputting the signal whose pulse width is adjusted.

11. The semiconductor memory device as recited in claim 10, wherein the output controlling means contains:
an R-S flip-flop whose set signal is the output signal of the external precharge detecting means and reset signal is a power-up signal;
a first inverter for inverting an output signal the active drive securing means;
a first NAND gate receiving an output signal of the first inverter and that of the R-S flip-flop as its input signals;
a second inverter for inverting an output signal of the first NAND gate;
an inverter chain for inverting and delaying an output signal of the second inverter; and
a second NAND gate for producing the output signal of the output controlling means based on the output signal of the second inverter and an output signal of the inverter chain.

12. The semiconductor memory device as recited in claim 9, wherein the active drive securing means includes:

an edge detecting means for detecting an edge of the internal active signal and outputting an edge detection signal; and a delay means for delaying the edge detection signal as long as the minimum row active time.

13. The semiconductor memory device as recited in claim 12, wherein the edge detecting means contains:

a first inverter for inverting the internal active signal;

a PMOS and an NMOS transistor which are connected in parallel to each other between a supply voltage node and a ground voltage node and whose gates are inputted with the internal precharge signal and an output signal of the first inverter, respectively, a latch for latching a voltage on a connecting node of the PMOS transistor and the NMOS transistor; and a second inverter for outputting the edge detection signal by inverting an output signal of the latch.

* * * * *